United States Patent
Sumiyoshi

(10) Patent No.: US 10,283,609 B2
(45) Date of Patent: May 7, 2019

(54) SEMICONDUCTOR DEVICE

(71) Applicant: SUMITOMO ELECTRIC INDUSTRIES, LTD., Osaka (JP)

(72) Inventor: Kazuhide Sumiyoshi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/710,439

(22) Filed: Sep. 20, 2017

(65) Prior Publication Data

US 2018/0090584 A1    Mar. 29, 2018

(30) Foreign Application Priority Data

Sep. 23, 2016 (JP) .................. 2016-185742

(51) Int. Cl.
| | |
|---|---|
| H01L 29/47 | (2006.01) |
| H01L 29/812 | (2006.01) |
| H01L 29/66 | (2006.01) |
| H01L 29/778 | (2006.01) |
| H01L 29/40 | (2006.01) |
| H01L 29/20 | (2006.01) |

(52) U.S. Cl.
CPC ...... H01L 29/475 (2013.01); H01L 29/66462 (2013.01); H01L 29/7786 (2013.01); H01L 29/812 (2013.01); *H01L 29/2003* (2013.01); *H01L 29/402* (2013.01)

(58) Field of Classification Search
CPC ............................ H01L 29/475; H01L 29/812
USPC .................................. 257/194, 280
See application file for complete search history.

(56) References Cited

U.S. PATENT DOCUMENTS

| | | | | |
|---|---|---|---|---|
| 7,071,526 | B2 * | 7/2006 | Ando | H01L 29/475 |
| | | | | 257/473 |
| 9,425,267 | B2 * | 8/2016 | Huang | H01L 29/402 |
| 9,640,647 | B2 * | 5/2017 | Okazaki | H01L 29/402 |
| 2003/0107101 | A1 | 6/2003 | Nishii et al. | |
| 2003/0109088 | A1 | 6/2003 | Nishii et al. | |

FOREIGN PATENT DOCUMENTS

JP        2001-156081      6/2001

* cited by examiner

*Primary Examiner* — Mark V Prenty
(74) *Attorney, Agent, or Firm* — Smith, Gambrell & Russell, LLP.

(57) ABSTRACT

A nitride semiconductor device is disclosed, where the nitride semiconductor device is a type of field effect transistor having a gate electrode and an insulating film covering the gate electrode. The gate electrode has stacked metals of nickel (Ni) and gold (Au), while, the insulating film is made of silicon nitride (Si). A feature of the gate electrode of the present invention is that the nickel layer contains silicon (Si) atoms at an atomic concentration from 0.01 at % to 10 at %.

5 Claims, 5 Drawing Sheets

SEMICONDUCTOR DEVICE

BACKGROUND OF THE INVENTION

1. Field of the Invention

The present invention relates to a semiconductor device, in particular, the invention relates to a gate structure of a semiconductor device primarily made of nitride semiconductor material.

2. Background Arts

A semiconductor device type of field effect transistor (FET) primarily made of compound semiconductor materials provides electrodes and a passivation film that protects the electrode and is made of silicon nitride (SiN). A Japanese Patent Application laid open No. JP-2001-156081A has disclosed such an FET with the gate electrode made of palladium (Pd). In FETs made of nitride compound semiconductor materials, the gate electrode or a Schottky contact against nitride semiconductor materials often contains nickel (Ni). However, nickel (Ni) likely and easily couples with silicon (Si) so as to form nickel-silicide having a stable characteristic. That is, an inter diffusion between nickel (Ni) in the gate electrode and silicon (Si) in the passivation film may possibly occur. However, a silicide material usually shows relatively greater resistivity. Accordingly, the passivation film possibly reduces the resistivity thereof by Ni atoms diffusing from the gate electrode; while, the gate electrode possibly increases the resistivity thereof by Si atoms diffusing from the passivation film.

SUMMARY ON INVENTION

An aspect of the present invention relates to a semiconductor device that comprises a substrate, a semiconductor layer, a first insulating film, a gate electrode and a second insulating film. The semiconductor layer is epitaxially grown on the semiconductor substrate. The first insulating film covers the semiconductor layer and an opening that exposes a surface of the semiconductor layer. The gate electrode makes a Schottky contact against the semiconductor layer through the opening in the first insulating film. The second insulating film covers the gate electrode and the first insulating film. A feature of the semiconductor device of the invention is that the second insulating film is made of silicon nitride and the gate electrode contains silicon (Si) atoms by 0.01 to 10 atomic percent and nickel (Ni).

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENT

The inter diffusion between Ni atoms and Si atoms is first described. Various specimens were prepared for investigating the inter diffusion between Ni atoms and Si atoms. The specimens provided, on a substrate made of silicon carbide (SiC), a nitride semiconductor layer, a Ni layer with a thickness of 80 nm, gold (Au) layer with a thickness of 120 nm, and a silicon nitride (SiN) film thereon. The nitride semiconductor layer included, from the side of the substrate, an aluminum nitride (AlN) layer with a thickness of 300 nm, a gallium nitride (GaN) layer with a thickness of 1 µm, an aluminum gallium nitride (AlGaN) layer with a thickness of 20 nm, and another GaN layer with a thickness of 5 nm. The Ni layer and the Au layer simulated a gate electrode; while, the AlN layer, the GaN layer, the AlGaN layer, and the other GaN layer simulated a nucleus layer, a channel layer, a barrier layer, and a cap layer in a filed effect transistor (FET), respectively. The SiN film had a thickness of 400 nm that simulated the passivation film. The metal layers of Ni and Au were formed by the metal evaporation; while, the SiN film was formed by a plasma enhanced chemical vapor deposition (PECVD) technique.

Seven types of specimens as listed in the Table were prepared, where the Ni layer in specimen S1 was formed with no Si atoms. Specimens, S2 to S7, were formed so as to contain Si atoms by 0.008 atomic percent (at %), 0.01 at % ($2.4 \times 10^{18}$ cm$^{-3}$), 0.1 at % ($2.4 \times 10^{19}$ cm$^{-3}$), 1 at % ($2.4 \times 10^{20}$ cm$^{-3}$), 10 at %, and 13 at %, respectively. With adjusted Si amounts contained in a Ni source in the metal evaporation, those specimens containing various Si amounts were prepared. Because specimen S1 was formed so as to contain no Si atoms, the secondary ion mass spectroscopy (SIMS) analysis detected Si atoms of merely 0.0004 at %, which was almost the detection limit of the SIMS analysis.

Those specimens were heat-treated at 350° C. so as to cause the inter diffusion between Ni atoms and Si atoms in the SiN layer and the Ni layer, respectively. The visual inspection investigated the surfaces of the SiN films before and after the heat treatment for the respective specimens, the energy dispersive X-ray spectroscopy (EDX) and the Auger electron spectroscopy (AES) investigated the Ni concentrations in the SiN films as digging the surfaces of the SiN films by the focused ion beam (FIB).

Figure 5A:
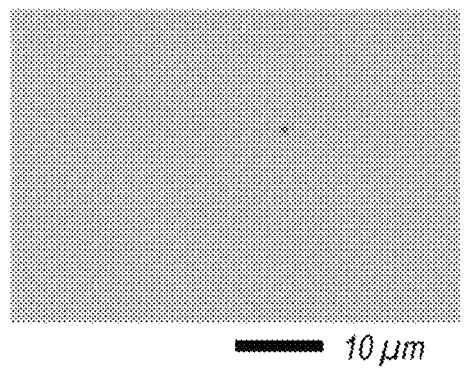
FIGS. 5A to 5C show surfaces of an insulating film.
Figure 5B:
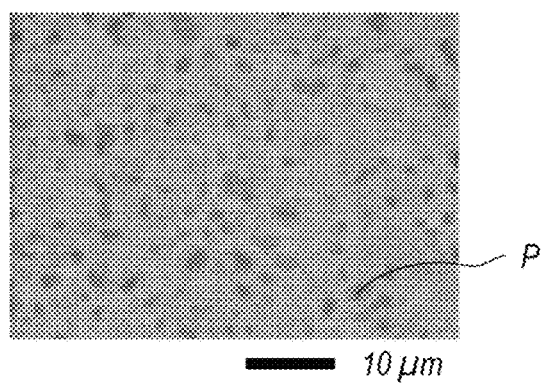
Figure 5C:
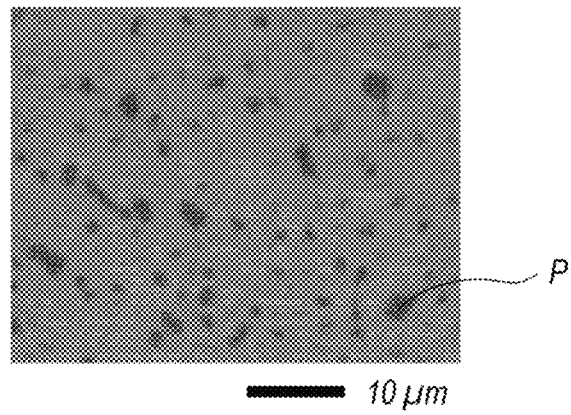

FIGS. 5A to 5C show surfaces of the specimen S1 before the heat treatment, after the heat treatment for 10 hours, and after the heat treatment for 30 hours, respectively. As shown in FIG. 5A, the specimen with no heat treatment showed a smooth surface, while, FIGS. 5B and 5C showed many gray spots. The EDX analysis detected the existence of Ni atoms in the gray spots P, and the AES analysis determined the concentration of 10 to 25 at % of Ni atoms in the gray spots P. On the other hand, the EDX analysis and the AES analysis detected no Ni atoms except for the gray spots P. Thus, the gray spots P denote vestiges of diffused Ni atoms. In table below, symbols, A to C, mean that the surfaces of the specimens showing statuses shown in FIGS. 5A to 5C respectively.

TABLE

| | | Status of after Thermal Treatment | | | | | |
|---|---|---|---|---|---|---|---|
| | Si amount | period of thermal treatment (hours) | | | | | resistivity |
| Specimen | (at %) | 0 | 10 | 30 | 50 | 100 | 150 | ($\mu\Omega \cdot$ cm) |
| S1 | 0 | A | B | C | C | C | C | 3.0 |
| S2 | 0.008 | A | A | B | B | C | C | 3.1 |
| S3 | 0.01 | A | A | A | B | B | C | 2.9 |
| S4 | 0.1 | A | A | A | A | B | B | 3.0 |
| S5 | 1 | A | A | A | A | A | A | 3.1 |
| S6 | 10 | A | A | A | A | A | A | 4.2 |
| S7 | 13 | A | A | A | A | A | A | 5.2 |

As listed in table above, the specimen S1 showed the surface A without any heat treatment but the surface changed to the status B by 10 hours heat treatment, and changed to the status C by the heat treatment longer than 30 hours.

On the other hand, the specimen S2 kept the surface of the SiN film in the status A even after 10 hours heat treatment, changed to the status B by the heat treatment within 50 hours, and changed to the status C by 100 hours heat treatment. The specimen S3 kept the surface in the status A within 30 hours heat treatment but changed to the status B by 100 hours heat treatment, and to the status C by the heat treatment longer than 150 hours. For the specimen S4, the heat treatment within 50 hours kept the surface in the status A, changed to the status B by the heat treatment longer than 100 hours. For the specimens S5 to S7, even the heat treatment longer than 150 hours kept the surface in the status A. Thus, as the Si amount increases, the surface of the insulating film 26 kept the status A.

Thus, specimen S1 that was not contained with Si atoms in the Ni layer diffused Ni atoms into the SiN film through the Au layer; while, specimens, S2 to S7, that was contained with Si atoms effectively showed tolerance to the diffusion of Ni atoms. Only the status A shown in FIG. 5A after the heat treatment for 30 hours may be allowed for semiconductor devices. Specimens, S3 to S7, satisfied this criterion, which means that the Si amount in the Ni layer is preferable greater than 0.01%. More favorably, Si amount contained in the Ni layer is preferably greater than 1 at %, which corresponds to specimens, S5 to S7, showing the tolerance to the diffusion of Ni atoms even after the heat treatment for 100 hours.

Table above also indicates resistivity of Ni layer for specimens, S1 to S7, after the heat treatment under 350° C. for 30 minutes. The resistivity was evaluated from the resistivity of the composite metals of Ni and Au. Specimens, S1 to S5, showed substantially invariant resistivity but the resistivity increased in specimens, S6 and S7. Because nickel silicide (NiSi) inherently shows substantial resistivity of 20 to 50 $\mu\Omega \cdot$cm, a Ni layer containing many Si atoms becomes nickel silicide (NiSi) that shows the greater resistivity. However, greater resistivity in Ni layer, or the stack of Ni and Au possibly degrades performance of an FET because of the increased gate resistance.

First Embodiment

Figure 1:
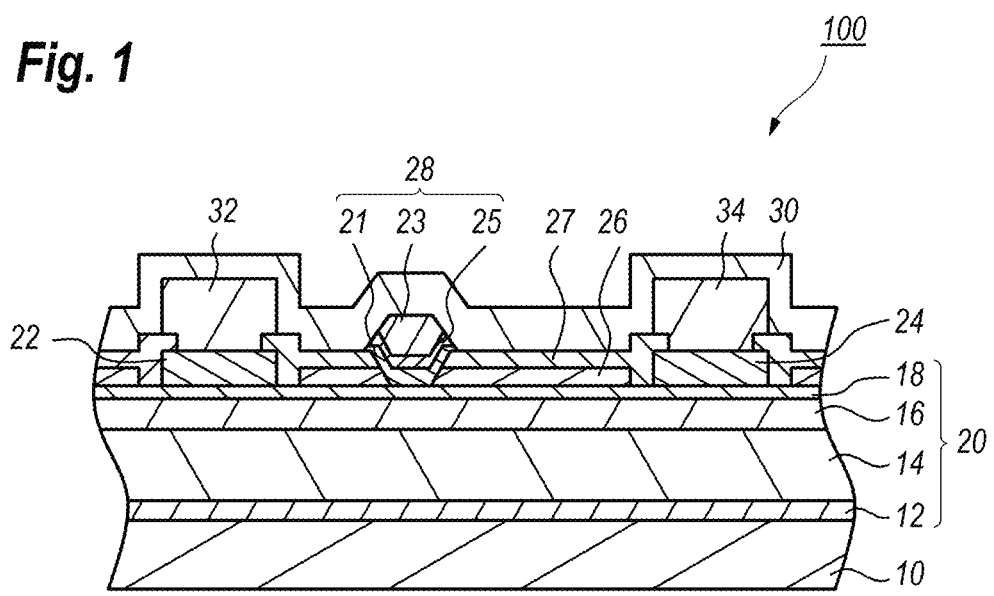
FIG. 1 shows a cross section of a semiconductor device according to the first embodiment of the present invention.

FIG. 1 shows a cross section of a semiconductor device according to the first embodiment of the present invention. The semiconductor device 100 is a type of field effect transistor (FET) providing a substrate 10, a nitride semiconductor layer 20, electrodes of a source 22, a drain 24 and a gate 28, insulating films, 26, 27, and 30, and interconnections, 32 and 34. The nitride semiconductor layer 20, which is grown on the substrate 10, stacks an aluminum nitride (AlN) layer 12, a gallium nitride (GaN) layer 14, an aluminum gallium nitride (AlGaN) layer 16, and another GaN layer 18 from the side of the substrate 10 in this order. The substrate 10 may be made of silicon carbide (SiC) with a surface orientation (0001) in a top surface thereof. The nitride semiconductor layer 20 is epitaxially grown on the top surface of the substrate 10 toward the crystal orientation of [0001]. The AlN layer 12 has a thickness of 300 nm and operates as a nucleus layer. The GaN layer 14 is an undoped layer having a thickness of 1 µm and operates as a channel layer that transports electrons. The AlGaN layer 16 is an n-type layer with a thickness of 20 nm and operates as an electron supplying layer, or sometimes called as a barrier layer. The other GaN layer 18 is an n-type layer with a thickness of 5 nm and operates as a cap layer.

Provided on the other GaN layer 18 are the electrodes of the source 22 and the drain 24, where they show un-rectified characteristics for the carrier transportation and usually are called ohmic electrodes. The other GaN layer 18 further provides two insulating films, 26 and 27, and the gate electrode 28 that shows a rectified characteristic called a Schottky electrode. The source and drain electrodes, 22 and 24, are formed from a stacked metal of titanium (Ti) with a thickness of 30 nm and aluminum (Al) with a thickness of 300 nm. Provided on the source and drain electrodes, 22 and 24, are the interconnections, 32 and 34, respectively. These interconnections, 32 and 34, contain gold (Au) and have resistivity around 3 $\mu\Omega \cdot$cm.

The insulating film 26, which is hereafter called as the first insulating film and extends between the source and drain electrodes, 22 and 24, is in direct contact to the nitride semiconductor layer 20. Provided on the first insulating film 26 is the other insulating film 27 that partly extend on the source and drain electrodes, 22 and 24. These two insulating films, 26 and 27, provide an opening between the source and the drain electrodes, 22 and 24, where the gate electrode 28 is formed therein so as to be in direct contact with the nitride semiconductor layer 20.

The gate electrode 28 stacks metals of nickel (Ni) 21 with a thickness of 50 nm, palladium (Pd) 25 with a thickness of 50 nm, and gold (Au) 23 with a thickness of 400 nm from the side of the other GaN layer 18. The Ni layer 21, which is in contact with the other GaN layer 18 and the first insulating film 26, shows a function of the Schottky electrode. The Ni layer 21 contains silicon (Si) by an amount of 0.1 atomic percent (0.1 at %) to 10 atomic percent (10 at %), which corresponds to a range from $2.4 \times 10^{19}$ to $2.4 \times 10^{21}$ cm$^{-3}$. The Pd layer 25 operates as a barrier layer for preventing the inter diffusion between nickel (Ni) and gold (Au). The Au layer 23 reduces the resistivity of the gate electrode 28.

Still another insulating film 30, which is hereafter called the second insulating film, covers the gate electrode 28 and the other insulating film 27. Specifically, the second insulating film 30 covers and is in contact with sides and a top of the gate electrode 28, while, the second insulating film 30 covers the interconnections, 32 and 34. The first insulating film 26 may be made of silicon nitride (SiN) with a refractive index greater than 2.2 and a thickness of 50 nm. The thickness of the first insulating film 26 is preferably from 15 to 100 nm. The other insulating film 27 also may be made of silicon nitride (SiN) but have a refractive index smaller than 2.2 and a thickness of 40 nm, preferably 20 to 100 nm. Thus, the first insulating film 26 has a silicon (Si) composition against nitrogen (N) greater than that of the other insulating film 27 and the second insulating film 30.

Process of Forming Semiconductor Device 100

Next, a process of forming the semiconductor device 100 will be described as referring to FIGS. 2A to 2E, where those figures show cross sections of the semiconductor device 100 at respective steps.

Figure 2A:
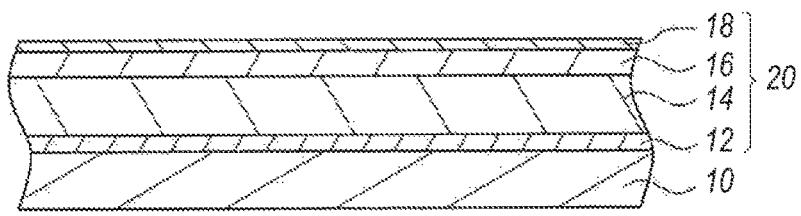
FIGS. 2A to 2E show cross sections of the semiconductor device of the first embodiment at respective process steps of forming the device.

As FIG. 2A illustrate, a metal organic chemical vapor deposition (MOCVD) technique may epitaxially grow the nitride semiconductor layer 20 on the substrate 10.

Figure 2B:
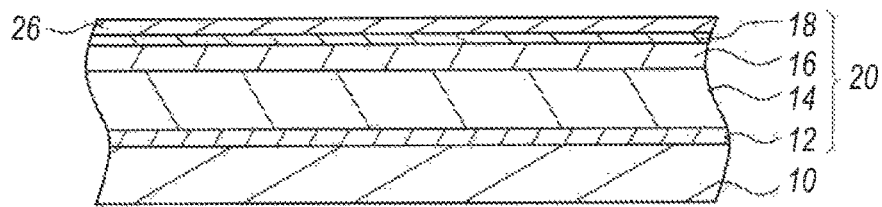
Figure 2C:
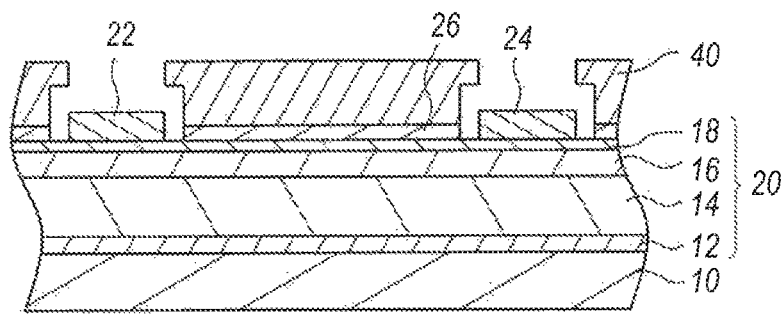
Figure 2D:
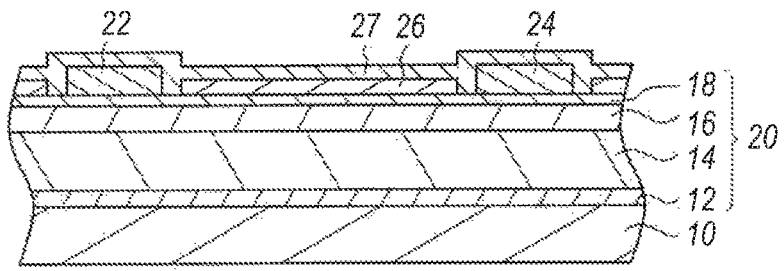
Figure 2E:
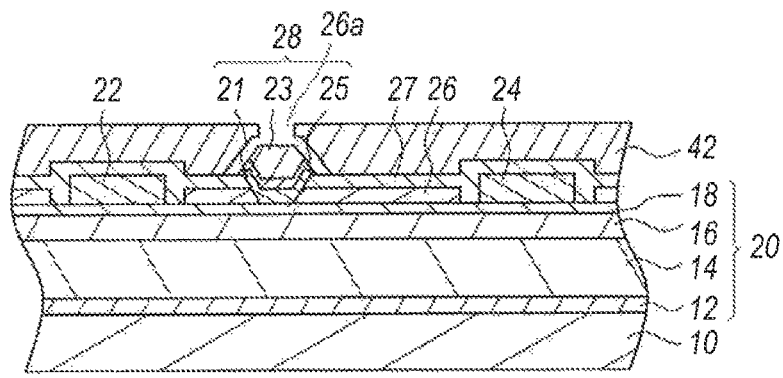

Thereafter, a plasma enhanced chemical vapor deposition (p-CVD) technique may deposit the first insulating film 26 on the other GaN layer 18, as FIG. 2B shows. Then, the process may form, on the first insulating film 26, an overhang structure by a mask 40 made of photoresist, specifically, the process coats the first insulating film 26 by double layered photoresists having exposure sensitivities different from each other, and sequential processes of the exposure and the development may form the overhang shown in FIG. 2C in respective openings corresponding to the ohmic metals. The openings formed in the photoresist 40 expose the first insulating film 26. Etching the exposed first insulating film 26 and subsequent metal evaporation, the ohmic metals, 22 and 24, are forming within the openings so as to be in direct contact with the other GaN layer 18. Because the other GaN layer 18 has the thickness of around 5 nm, the etching for the first insulating film 26 may possibly etch the other GaN layer 18. Even if the other GaN layer 18 is removed, the ohmic metals, 22 and 24, in direct contact with the AlGaN barrier layer 16 show the same function as an arrangement where the ohmic metals, 22 and 24, are on the other GaN layer 18. That is, the other GaN layer 18 may be substantially transparent for carrier transportation. Removing metals deposited on the photoresist 40 by the lift-off technique, the ohmic metals, 22 and 24, are formed on the nitride semiconductor layer 20. Alloying the ohmic metals at 550° C., preferably from 500 to 600° C. for the ohmic metals of titanium (Ti) and aluminum (Al), the source and drain electrodes, 22 and 24, make the un-rectified contact against the nitride semiconductor layer 20.

After the removal of the photoresist 40, the process deposits the other insulating film 27 that is made of silicon nitride (SiN) so as to cover the ohmic electrodes, 22 and 24, the first insulating film 26 between the source and drain electrodes, 22 and 24, and the nitride semiconductor layer 20 exposed within gaps between the ohmic electrodes, 22 and 24, and the first insulating film 26. Then, another patterned photoresist 42 is deposited on the other insulating film 27. The photoresist 42 has an opening 26a that exposes the surface of the other GaN layer 18.

A metal evaporation may form the gate electrode 28 on the surface of the other GaN layer 18 exposed within the opening 26a. As an alternative, a metal sputtering may also form the gate electrode 28. The gate electrode 28 in the nickel (Ni) layer thereof contains silicon (Si), or the Ni layer 21 is doped with Si. For instance, the metal evaporation using Ni and Si concurrently, the Ni layer 21 doped with Si may be easily obtained. After the formation of the Ni layer 21, the photoresist 42 is removed concurrently with Ni on the photoresist 42.

Thereafter, the other insulating film 27 in parts thereof corresponding to the ohmic electrodes is removed to expose the top of the source and the drain electrodes, 22 and 24. Then, metal plating may selectively forms the interconnections, 32 and 34, on the exposed electrodes, 22 and 24. Finally, the second insulating film 30 deposited by the PECVD covers the other insulating film 27, and the interconnections, 32 and 34. Thus, the process of forming the semiconductor device 100 is completed.

Because the Ni layer 21 contains Si atoms, or doped with Si, the inter diffusion of Ni atoms into the insulating films, 27 and 30, may be effectively suppressed, which also suppresses degradation of the breakdown voltage of the semiconductor device 100 caused by the inter diffusion of Ni atoms, and the short-circuit between the drain electrode 24 and the gate electrode 28. Also, because the Ni layer 21 has a thickness of merely 50 nm, the inter diffusion of Ni atoms leaves defects and vacancies in the Ni layer 21, which means that the equivalent gate length becomes shorter and the threshold voltage of the FET becomes deeper. The first embodiment of the invention may effectively suppress the shortening of the gate length and the change in the device performance.

The gate electrode 28 includes the Ni layer 21, the Au layer 23, and the Pd layer 25, where the Au layer 23 and the Pd layer 25 operate as barrier layers for the inter diffusion of Ni atoms. The Ni atoms possibly inter diffuses through the barrier layer of Au and Pd. However, because the Ni layer contains, or doped with, Si atoms, which may effectively suppress the inter diffusion of Ni atoms. The Au layer 23 may maintain the resistivity of the gate electrode 28 in low. The Au layer 23 may be replaced to any other metals having resistivity smaller than Ni. The Pd layer 25 is not always necessary. Also, the Au layer 23 and the Pd layer 25 are not always necessary. Only the Ni layer 21 may form the gate electrode 28. Even when the Ni layer 21 is in contact with the first insulating film 26 and the second insulating film 30, the inter diffusion of Ni atoms may be suppressed by doping the Ni layer 21 with Si. In an alternative, an alloy containing Ni may be a gate electrode.

The Ni layer 21 may contain Si by an amount of 0.01 to 10 at %. Even when the Ni layer 21 does not intentionally contain Si, the Ni layer possibly contains Si by an amount of 0.004 at %. Such a Ni layer may inter diffuse Ni atoms. Accordingly, the Ni layer preferably contains Si by an amount of at least 0.01 at %. Such a Ni layer may effectively suppress the inter diffusion of Ni atoms even after 30 hours of heat treatment under 350° C.

On the other hand, nickel (Ni) may easily form a nickel-silicide (NiSi) by capturing silicon Si, and the NiSi has been known as a stable silicide material but having relatively high resistivity. That is, the Si concentration in the Ni layer 21 is preferably low as possible because a gate metal with substantial resistivity possibly degrades performance of the FET. For instance, the resistivity of the gate electrode is preferably 4.5 μ·Ωcm or smaller. Accordingly, the Si concentration in the Ni layer 21 is preferably smaller than 10 at %. Thus, the Si concentration in the Ni layer 21 is preferably between 0.1 at % to 10 at %.

Referring to FIG. 1, the gate electrode 28 fills the opening 26a formed in the insulating films, 26 and 27, on the nitride semiconductor layer 20. As described, the heat treatment of the semiconductor device 100 may accelerate the inter diffusion of Ni atoms into the insulating films, 26 and 27, which substantially varies the gate length and accordingly, the device performance including the threshold voltage of the semiconductor device 100. The first embodiment of the invention may effectively suppress the inter diffusion of Ni atoms into the insulating films, 26 and 27, the variation of the gate length and the device performance may be suppressed.

The first insulating film 26 has the ratio of silicon (Si) against nitride (N) that is higher than those of the insulating film 27 and the second insulating film 30. For instance, the first insulating film 26 has the ratio of Si against N (Si/N) of 0.9 to 1.3. Accordingly, the first insulating film 26 with a greater ratio of Si against N may easily capture or extract oxygen (O) from the surface of the nitride semiconductor layer 20, which has been known as a countermeasure against the current collapsing. However, the first insulating film 26 usually shows a lesser crystal quality, which means that a binding between Si and N is weak. Accordingly, nickel (Ni) atoms easily inter diffuse therein. However, the embodiment of the invention forms the first insulating film 26 before the formation of the source and drain electrodes, 22 and 24, which means that the first insulating film 26 is implicitly heat treated during the alloy of the ohmic metals at around 500° C., which makes the first insulating film 26 hard and dense. Accordingly, the first insulating film 26 becomes hard to be inter diffused with Ni atoms compared with the insulating films, 27 and 30. The Ni layer 21 containing Si by a substantial amount of 0.1 at % to 10 at % may effectively suppress the inter diffusion ref Ni atoms and the first insulating film 26 heat treated at around 500° C. is also hard to be inter diffused for Ni atoms. The insulating films, 26, 27, and 30, may be replaced by silicon nitride (SiN) to silicon oxide (SiO), silicon oxy-nitride (SiON).

The gate electrode 28 may be a stacked metal of the Ni layer 21 with a thickness of 80 nm and the Au layer 23 with a thickness of 120 nm. The gate electrode 28 preferably has the resistivity smaller than 4.5 μΩ·cm.

Second Embodiment

Figure 3:
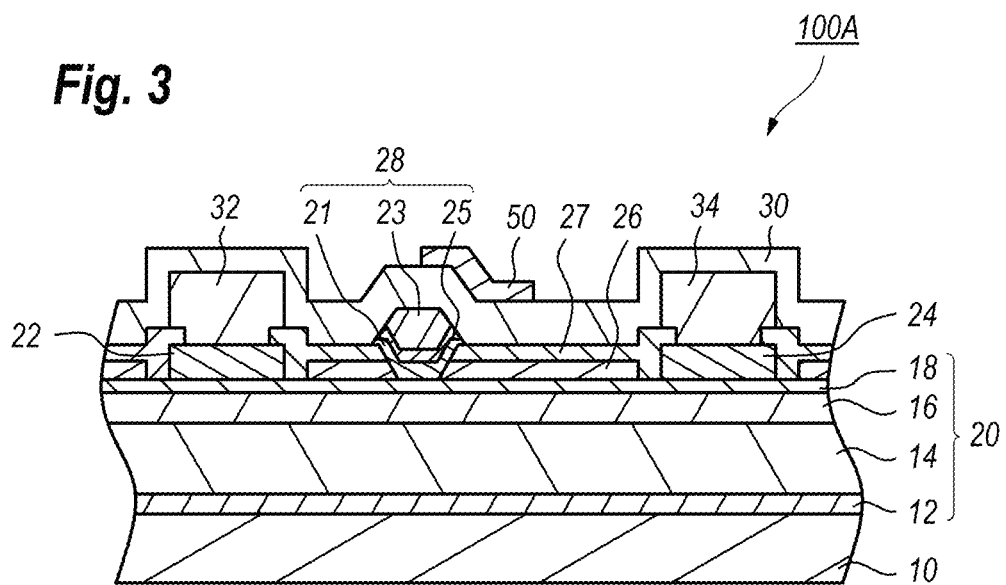
FIG. 3 shows a cross section of another semiconductor device according to the second embodiment of the invention.

FIG. 3 shows a cross section of a semiconductor device 100A according to the second embodiment, where the semiconductor device 100A provides a field plate 50. Elements in the second embodiment same with those of the first embodiment will be omitted in explanations thereof.

As FIG. 3 shows, the second embodiment 100A provides the field plate 50 on the insulating film 30 so as to overlap with the gate electrode 28 and extend between the gate electrode 28 and the drain electrode 24. The field plate 50 may be made of stacked metals of titanium (Ti) with a thickness of 5 nm and gold (Au) with a thickness of 200 nm from the side of the insulating film 30. The field plate 50 and the insulating film 50 may be covered with another insulating film made of, for instance, silicon nitride (SiN), polyimide, and so on. FIG. 3 omits the other insulating film.

Figure 4:
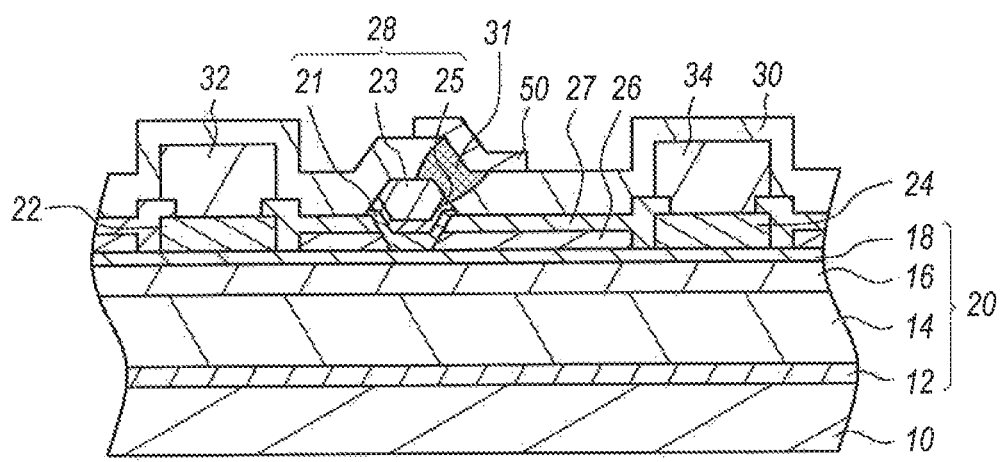
FIG. 4 shows a cross section of a semiconductor device with a gate leak path in the insulating film covering the gate electrode.

When the gate electrode 28, in particular, the nickel layer 21 thereof does not contain, or, is not doped with silicon (Si), Ni atoms in the nickel layer 21 and Si atoms in the insulating film 30 may cause the inter diffusion during a heat treatment of the semiconductor device for a long time, which reduces the resistivity of the insulating film 30 and degrades the breakdown voltage of the device. Because the field plate 50 overlaps with the gate electrode 28, a distance therebetween is substantially equivalent to a thickness of the insulating film 30, which is far shorter than a distance from the gate electrode 28 to the source electrode 22 or to the drain electrode 24. Thus, when the insulating film 30 degrades the breakdown voltage thereof, the gate electrode 28 is likely to form a leak path 31 to the field plate 50, as shown in FIG. 4.

The second embodiment of the present invention contains or dopes Si atoms in the Ni layer 21, which may suppress the inter diffusion between Ni atoms in the nickel layer 21 and Si atoms in the insulating film 30. Thus, the inter diffusion may be effectively suppressed and the insulating film 30 may maintain the enough resistivity thereof. Even the field plate 50 is provided along the gate electrode 28 and overlaps with the gate electrode 28, the reduction of the breakdown voltage for the gate electrode 28 may be effectively suppressed.

The nitride semiconductor layer 20 in the first and second embodiment contains nitrogen (Ni), which may be, in addition to gallium nitride (GaN), and aluminum gallium nitride (AlGaN), indium gallium nitride (InGaN), indium nitride (InN), aluminum nitride (AlN), indium aluminum nitride (InAlN), aluminum indium gallium nitride (AlInGaN), and so on. Moreover, the present invention concentrates on cases where the semiconductor devices, 100 and 100A, have the type of field effect transistor (FET), but the invention may have a scope including other types of semiconductor devices.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The present application claims the benefit of priority of Japanese Patent Application No. 2016-185742, filed on Sep. 23, 2016, which is incorporated herein by reference.

I claim:

1. A semiconductor device comprising:
a substrate;
a semiconductor layer provided on the substrate;
a first insulating film provided on the semiconductor layer, the first insulating film having an opening that exposes the semiconductor layer therein;
a gate electrode including stacked layers of metal including nickel (Ni), gold (Au), and palladium (Pd), the Ni making Schottky contact with the semiconductor layer through the opening in the first insulating film, the gate electrode also containing silicon (Si) by 0.01 to 10 atomic percent; and
a second insulating film that covers the gate electrode and the first insulating film, the second insulating film being made of silicon nitride (SiN).

2. The semiconductor device of claim 1, wherein the gate electrode has a resistivity smaller than 4.5 μΩ·cm.

3. The semiconductor device of claim 1, further including a field plate provided on the second insulating film, the field plate extending along the gate electrode and having a portion overlapping with the gate electrode.

4. The semiconductor device of claim 1, wherein the silicon is contained in the Ni layer.

5. The semiconductor device of claim 4, wherein
the Pd layer operates as a barrier layer preventing inter diffusion between the Ni and the Au; and
the Au layer reduces resistivity in the gate electrode.

* * * * *